(12) United States Patent
Rasalingam et al.

(10) Patent No.: US 11,778,748 B2
(45) Date of Patent: Oct. 3, 2023

(54) CONNECTOR FOR PRINTED CIRCUIT BOARD (PCB) MEMORY DRIVE

(71) Applicant: Western Digital Technologies, Inc., San Jose, CA (US)

(72) Inventors: Uthayarajan A/L Rasalingam, Nibong Tebal (MY); Go Beng Siong, Bayan Lepas (MY)

(73) Assignee: Western Digital Technologies, Inc., San Jose, CA (US)

( * ) Notice: Subject to any disclaimer, the term of this patent is extended or adjusted under 35 U.S.C. 154(b) by 231 days.

(21) Appl. No.: 17/180,067

(22) Filed: Feb. 19, 2021

(65) Prior Publication Data
US 2022/0271456 A1    Aug. 25, 2022

(51) Int. Cl.
| | |
|---|---|
| H05K 1/18 | (2006.01) |
| G11C 5/00 | (2006.01) |
| H05K 1/00 | (2006.01) |
| H05K 1/14 | (2006.01) |

(52) U.S. Cl.
CPC ............... *H05K 1/189* (2013.01); *G11C 5/00* (2013.01); *H05K 1/00* (2013.01); *H05K 1/14* (2013.01); *H05K 1/181* (2013.01); *H05K 2201/05* (2013.01); *H05K 2201/10159* (2013.01)

(58) Field of Classification Search
CPC .. H05K 1/00; H05K 1/02; H05K 1/14; H05K 1/141–147; H05K 1/18; H05K 1/181–187
USPC ................ 361/770–774, 784, 790–795, 803, 361/752–753, 801–802; 257/685–690, 257/737–739
See application file for complete search history.

(56) References Cited

U.S. PATENT DOCUMENTS

| | | | | |
|---|---|---|---|---|
| 5,793,998 A | * | 8/1998 | Copeland | G06F 13/4095 710/305 |
| 6,472,735 B2 | * | 10/2002 | Isaak | H05K 1/141 257/777 |
| 6,597,062 B1 | * | 7/2003 | Li | H05K 1/144 257/777 |
| 7,550,836 B2 | * | 6/2009 | Chou | H01L 25/50 438/118 |
| 7,829,992 B2 | * | 11/2010 | Sugino | H01L 25/105 257/737 |
| 9,865,310 B2 | * | 1/2018 | Cantle | H05K 1/141 |
| 10,064,305 B1 | * | 8/2018 | Zhai | H05K 7/1425 |
| 10,082,842 B1 | * | 9/2018 | Looi | G06F 13/409 |
| 10,332,854 B2 | * | 6/2019 | Katkar | H01L 23/5389 |
| 2016/0306768 A1 | * | 10/2016 | Mataya | G11C 16/26 |
| 2017/0164501 A1 | * | 6/2017 | Killen | H05K 7/1492 |
| 2018/0242469 A1 | * | 8/2018 | Suzuki | H05K 7/20472 |
| 2019/0050305 A1 | * | 2/2019 | Mahesh | G06F 11/2092 |
| 2019/0095774 A1 | * | 3/2019 | Ping | G06F 13/387 |
| 2019/0235589 A1 | * | 8/2019 | Murillo | G06F 1/266 |
| 2020/0411496 A1 | * | 12/2020 | Zhang | H01L 25/50 |

* cited by examiner

*Primary Examiner* — Tuan T Dinh
(74) *Attorney, Agent, or Firm* — Michael Best & Friedrich LLP

(57) ABSTRACT

A data storage device including a first printed circuit board (PCB) and a second PCB. The first PCB includes a controller, an interface configured to interface with a host device, and a first connector. The second PCB includes a non-volatile memory and a second connector. The second connector is configured to couple to the first connector to establish a communication connection between the controller and the non-volatile memory.

14 Claims, 6 Drawing Sheets

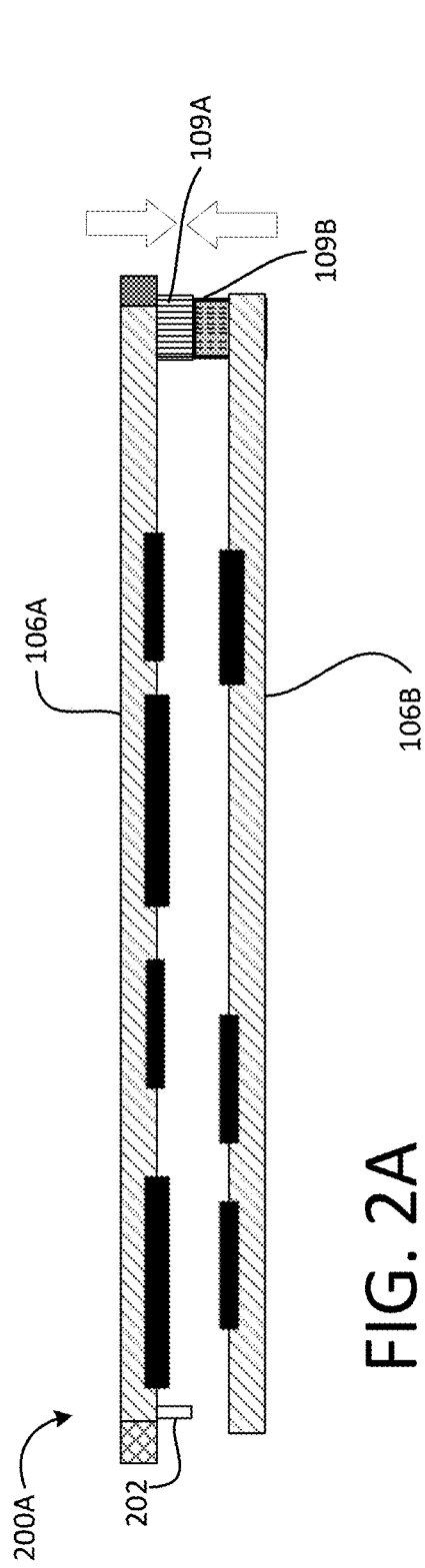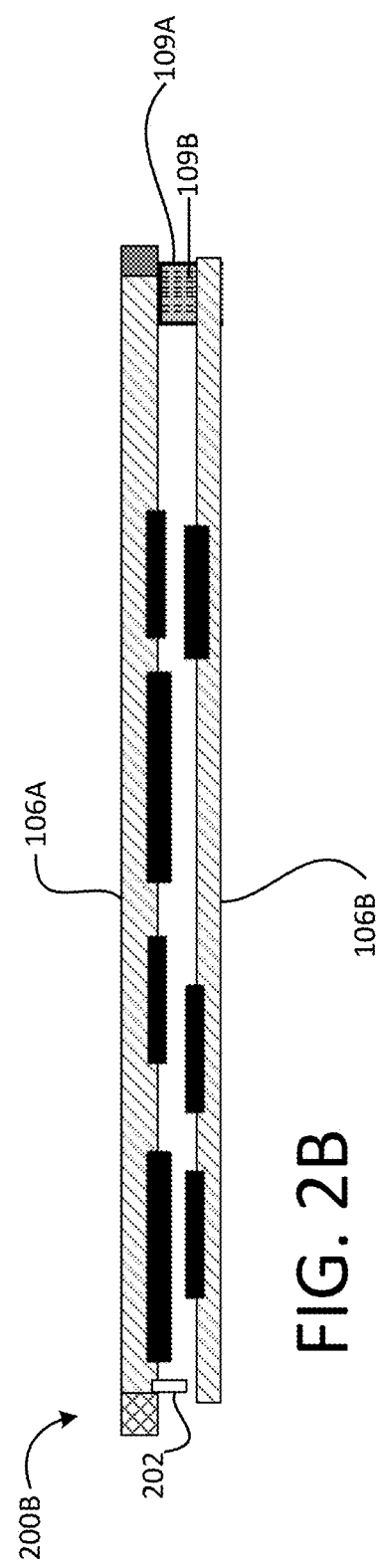
FIG. 2A
FIG. 2B

CONNECTOR FOR PRINTED CIRCUIT BOARD (PCB) MEMORY DRIVE

FIELD

This application relates generally to electrical connectors and, more particularly, to data storage devices including such electrical connectors.

BACKGROUND

Solid State Drive (SSD) data storage devices are used in various electronic devices and systems for data storage. SSDs include a flash controller, a volatile memory (in some SSDs), and a non-volatile NAND flash memory. The flash controller interfaces with a main electronic processor of the electronic device/system to persistently store and retrieve data from the electronic device/system into the NAND flash memory.

The capacity and speed of memory arrangements in data storage devices, such as SSD's, is continually improving as technology advances. Demand for higher processing speeds requires increased throughput of memory arrangements. As such, manufacturers of storage devices seek to increase both storage capacity and data throughput for their devices. While it is desirable to increase storage capacity of memory arrangements, the size of the packaged memory device may not be easily increased. Further, such improvements are nearly always sought to be implemented at a relatively low cost.

SUMMARY

When additional memory is necessary for an electronic device/system, a new SSD would need to be purchased. However, a new SSD with larger capacity may be expensive and may be limited as far as its size by the size of the physical space where it is to be installed.

The disclosure provides a data storage device that includes a removably couplable flash memory printed circuit board. When the electrical device/system storing data on the data storage device requires a flash memory capacity greater than what the data storage device is able to (for example, from 16 TB to 32 TB), rather than having to replace the entire data storage device with a larger memory data storage device, only a portion of the disclosed data storage device (in particular, a flash memory circuit board) has to be removed. The flash memory circuit board is removed and replaced, via a connector, with a new flash memory circuit board with a larger memory capacity. Thus, the disclosed data storage device provides easily expandable memory capacity for a lower cost without the need for purchasing and installing a new data storage drive. Furthermore, the removeably couplable flash memory printed circuit board (PCB) may be the same or a smaller size than the original flash memory printed circuit board so that the larger memory capacity flash memory PCB will fit in the physical space in which it is to be installed.

In one embodiment, the data storage device includes a first printed circuit board including an electronic processor (i.e., a controller), an interface configured to interface with a host device, and a first connector. The data storage device also includes a second printed circuit board including a non-volatile memory and a second connector configured to couple to the first connector to establish a communication connection between the electronic processor and the non-volatile memory.

The disclosure also includes a method for expanding capacity of a data storage device. The data storage device includes a first PCB including a controller, an interface configured to interface with a host device, and a first connector. A second PCB includes a first non-volatile memory and a second connector configured to couple to the first connector. The method includes providing another PCB connectable to the first PCB and including a second non-volatile memory and another connector configured to couple to the first connector to establish a communication connection between the controller and the second non-volatile memory, wherein the second non-volatile memory has a larger capacity than the first non-volatile memory.

The disclosure also includes a method for expanding capacity of a data storage device. The method includes removing a previously installed PCB from a first PCB including an electronic processor, an interface configured to interface with a host device, and a first connector. The previously installed PCB includes a first non-volatile memory and a second connector configured to couple to the first connector. The method further includes connecting a second PCB to the first PCB, the second PCB including a second non-volatile memory and a third connector configured to couple to the first connector to establish a communication connection between the electronic processor and the second non-volatile memory, wherein the second non-volatile memory has a larger capacity than the first non-volatile memory.

The disclosure also provides a system including in one embodiment, a data storage device. The data storage device includes a first PCB and a second PCB. The first PCB includes an electronic processor, an interface configured to interface with a host device, and a first connector. The second PCB includes a non-volatile memory and a second connector. The second connector is configured to couple to the first connector to establish a communication connection between the processor and the non-volatile memory.

In this manner, various aspects of the disclosure provide for improvements in at least the technical fields of data storage devices and their design and architecture. The disclosure can be embodied in various forms, including hardware or circuits controlled by firmware; as well as hardware-implemented methods, signal processing circuits, memory arrays, application specific integrated circuits, field programmable gate arrays, and the like. The foregoing summary is intended solely to give a general idea of various aspects of the disclosure, and the foregoing summary does not limit the scope of the disclosure in any way.

BRIEF DESCRIPTION OF THE DRAWINGS

FIG. 2A is a diagram illustrating the data storage device of FIG. 1, in accordance with various aspects of the disclosure.

FIG. 2B is a diagram illustrating the data storage device of FIG. 1, in accordance with various aspects of the disclosure.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. It also will be understood by those of skill in the art that the drawings are not to scale, where some features are exaggerated in order to highlight such features.

In the following description, numerous details are set forth, such as data storage device configurations, controller operations, and the like, in order to provide an understanding of one or more aspects of the disclosure. It will be readily apparent to one skilled in the art that these specific details are merely exemplary and not intended to limit the scope of this application. The following description is intended solely to give a general idea of various aspects of the disclosure, and the following description does not limit the scope of the disclosure in any way.

Figure 1:
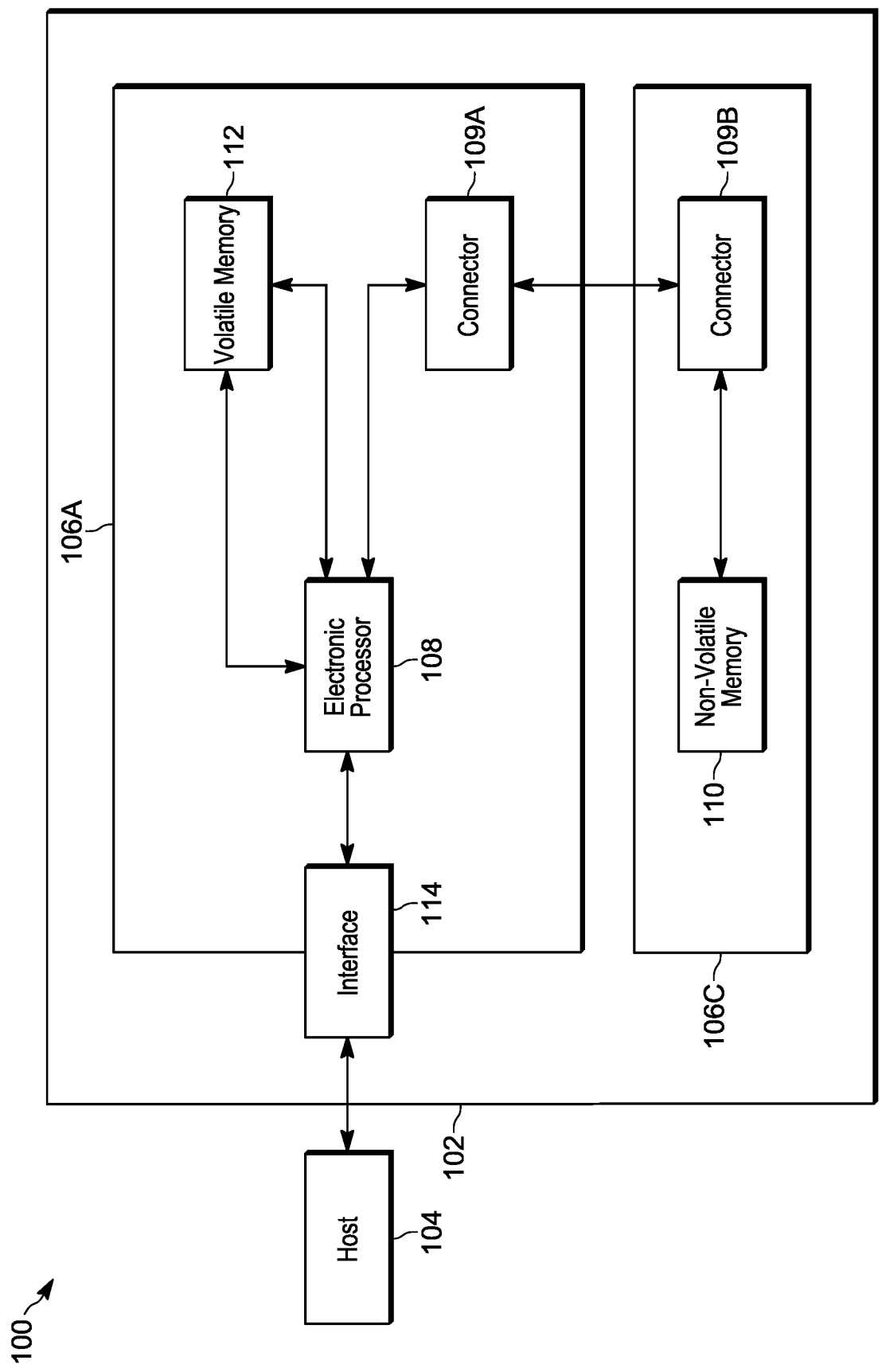
FIG. 1 is block diagram of one example of a system including a data storage device, in accordance with various aspects of the disclosure.

FIG. 1 is block diagram of a system 100 including a data storage device 102 and a host device 104, in accordance with some embodiments of the disclosure. The data storage device 102 includes a first printed circuit board (PCB) 106A and a second PCB 106C configured to communicatively and mechanically couple to each other by way of a respective first connector 109A and a second connector 109B. The data storage device 102 and/or the host device 104 may each also include a housing (not shown).

The first PCB 106A includes an electronic controller, which is referred to herein as an electronic processor 108, the connector 109A, and, in some embodiments, a volatile memory 112. The first PCB 106A may also include an interface 114 configured to interface (communicatively connect) with the host device 104. The second PCB 106C includes the connector 109B and a non-volatile memory (NVM) 110.

In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives. The host device 104 may issue one or more commands to the data storage device 102, such as one or more requests to erase data at, read data from, or write data to either or both NVM 110 and volatile memory 112 of the data storage device 102. Additionally, the host device 104 may issue one or more specific commands to the data storage device 102 to notify and/or configure the data storage device 102. For example, the host device 104 may be configured to provide data, such as user data, to be stored at a memory (for example, NVM 110 or volatile memory 112) or to request data to be read from the NVM 110 or volatile memory 112. The host device 104 may include a mobile smartphone, a music player, a video player, a gaming console, an electronic book reader, a personal digital assistant (PDA), a computer, such as a laptop computer or notebook computer, any combination thereof, or other suitable electronic device.

In some examples, components of the first PCB 106A may be dispersed or alternatively arranged on the second PCB 106C and vice versa (for example, the volatile memory 112 may be dispersed between both of the first PCB 106A and the second PCB 106C or, in another example, the interface 114 is located on the second PCB 106C. Furthermore, the data storage device 102 may include additional components not shown in FIG. 1 for sake of clarity. For example, the data storage device 102 may include one or more additional PCBs to which components of the first PCB 106A and/or the second PCB 106C are mechanically attached and that includes electrically conductive traces that electrically interconnect components of the data storage device 102, or the like. In some embodiments, the data storage device 102 may include fewer components, for example, where one or more of the volatile memory 112 and the interface 114 are part of the processor 108. In some examples, the physical dimensions and connector configurations of the data storage device 102 may conform to one or more standard form factors. Some example standard form factors of the data storage device may include 3.5" data storage device, 2.5" data storage device, and 1.8" data storage device. Some example standard form factors of the interface 114 may include peripheral component interconnect (PCI), PCI-extended (PCI-X), and PCI Express (PCIe) (e.g., PCIe x1, x4, x8, x16, PCIe Mini Card, MiniPCI, etc.). In some examples, the data storage device 102 may be directly attached (e.g., directly soldered) to a motherboard of the host device 104.

The interface 114 of the data storage device 102 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), or other suitable protocol. The interface 114 is communicatively connected (e.g., a data bus, a control bus, or other suitable connection) to the controller 108, allowing data to be exchanged between the host device 104 and the controller 108. In some examples, the interface 114 may also permit the data storage device 102 to receive power from the host device 104. In some examples, the data storage device 102 may be embedded within the host device 104. Alternatively, in other examples, the data storage device 102 may be removable from the host device 104 (i.e., "removably" coupled to the host device 104).

The NVM 110 may be part of a packaged integrated circuit (IC) or other packaged silicon device, such as a memory device. The NVM 110 may also include read/write circuitry that reads data from and writes data to another portion of the memory device. For instance, the read/write circuitry of the NVM 110 may receive data and a message from the processor 108 that instructs the read/write circuitry to store the data in the NVM 110. Similarly, the read/write circuitry of the NVM 110 may receive a message from the processor 108 that instructs the read/write circuitry to retrieve data from the NVM 110.

In some examples, the memory device may include any type of non-volatile memory. For example, the NVM 110 may include flash memory or any other suitable non-volatile memory. Flash memory may include NAND-based or NOR-based flash memory and may store data based on a charge contained in a floating gate of a transistor for each flash memory cell. In NAND-based flash memory, the flash memory may be divided into a plurality of blocks that may divided into a plurality of pages. Each block of the plurality of blocks may include a plurality of NAND cells. Rows of NAND cells may be electrically connected using a word line to define a page of a plurality of pages. Respective cells in each of the plurality of pages may be electrically connected to respective bit lines. Furthermore, NAND-based flash memory may be 2D or 3D, and may be single level cell (SLC), multi-level cell (MLC), triple level cell (TLC), or quad level cell (QLC).

The volatile memory 112 may be used by the electronic processor 108 to store information. The volatile memory 112 may be comprised of one or more volatile memory devices. In some examples, the electronic processor 108 may use the volatile memory 112 as a cache. For instance, the processor 108 may store cached information in the volatile memory 112 until the cached information is written to the NVM 110. Examples of the volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The electronic processor 108 manages one or more operations of the data storage device 102. For instance, the processor 108 manages the reading of data from and/or the writing of data to the NVM 110. In some embodiments, when the data storage device 102 receives a write command from the host device 104, the electronic processor 108 may initiate a data storage command to store data to the NVM 110 and monitor the progress of the data storage command. In other embodiments, the controller 108 may determine at least one operational characteristic of the storage system 100 and store the at least one operational characteristic in the NVM 110.

One example of the structural and functional features provided by the electronic processor 108 are illustrated in FIG. 1 in a simplified form. One skilled in the art would also recognize that the electronic processor 108 may include additional modules or components other than those specifically illustrated in FIG. 1. Additionally, although the data storage device 102 is illustrated in FIG. 1 as including the electronic processor 108, in other implementations, the electronic processor 108 is instead located separate from the data storage device 102. As a result, operations that would normally be performed by the electronic processor 108 described herein may be performed by another device that connects to the data storage device 102.

In some examples, the first PCB 106A may include circuits for processing and interfacing with the host device, for example, application-specific integrated circuits (ASIC), power management integrated circuits (PMIC), and microwave integrated circuits (MICS), while the second PCB 106C may include memory circuitry (for example, NAND memory circuitry) for storage of information of the host device managed by the first PCB 106A.

The first PCB 106A and the second PCB 106C may be operationally coupled via a connection (e.g., a communication path), such as a bus or other wired connection via a coupling of the first connector 109A and of the second connector 109B. In some embodiments, the first connector 109A is removably couplable to the second connector 109B. As an example, the first connector 109A may be removably coupled to the second connector 109B in accordance with a removable ball grid array (BGA) connection (socket) configuration.

FIGS. 2A and 2B provide an exemplary illustration 200A and 200B of the data storage device 102 of FIG. 1 according to some embodiments. In particular, FIGS. 2A and 2B illustrate the coupling of the first connector 109A of the first PCB 106A and of the second connector 109B of the a second PCB 106B. In some embodiments, the second connector 109B attaches with first connector 109A vertically such that the first PCB 106A and the second PCB 106B are vertically stacked atop each other. While the second PCB 106B is illustrated as being connected to the first PCB 106A underneath the first PCB 106A, the second PCB 106B may alternatively be connected to the first PCB 106A above the first PCB 106A in some embodiments. In some embodiments, the first PCB 106A and/or the second PCB 106B may include one or more additional elements to provide additional physical support and/or connection between the first PCB 106A and the second PCB 106B. For example, as also illustrated in FIGS. 2A and 2B, in some embodiments, the first PCB 106A (or, alternatively or additionally, the second PCB 106B) include a guide stop 202 to provide physical support between the first PCB 106A and the second PCB 106B.

Additionally, in some embodiments, one or both of the first PCB 106A and the second PCB 106B may include one or more physical holders (for example, a clip lock) to hold the first PCB 106A and the second PCB 106B together. In these embodiments, the physical holders may be positioned at one or more corners of the respective first and second PCBs 106A and 106B.

Figure 3:
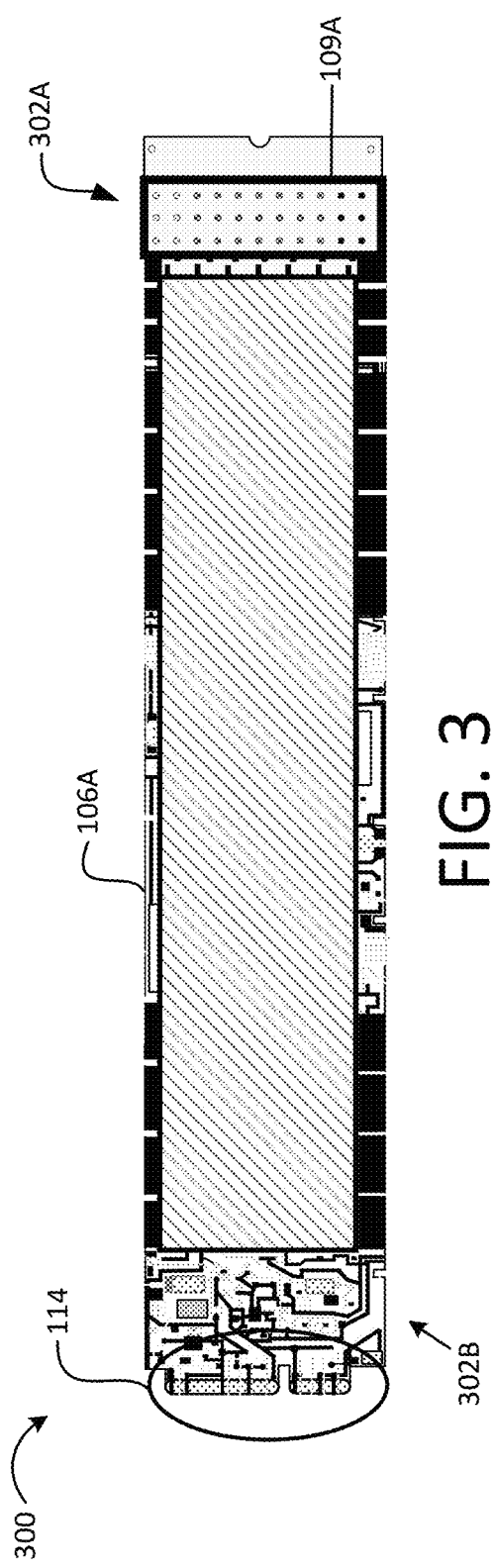
FIG. 3 is a first PCB of the data storage device of FIG. 1, in accordance with various aspects of the disclosure.
Figure 4:
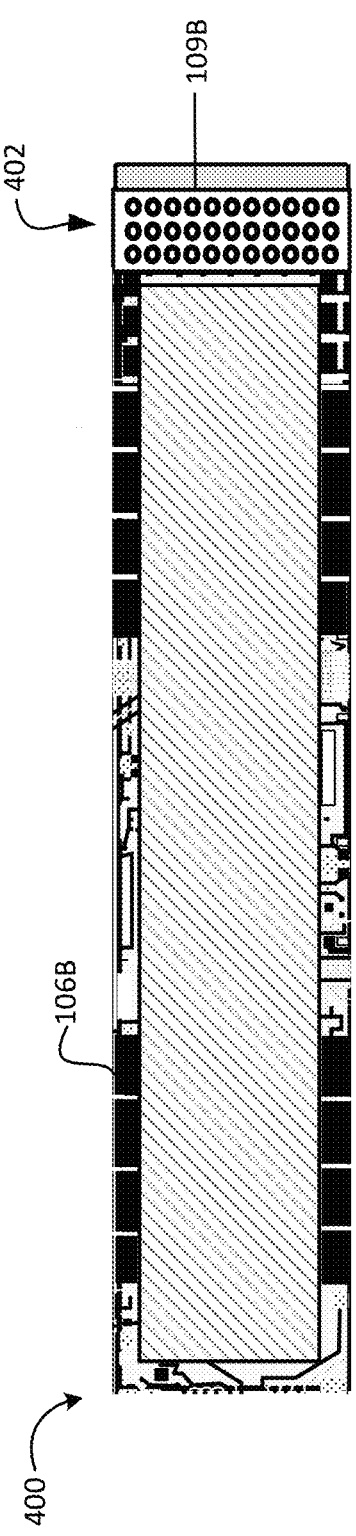
FIG. 4 is a second PCB of the data storage device of FIG. 1, in accordance with various aspects of the disclosure.

FIG. 3 illustrates a top-down view 300 of the first PCB 106A including the first connector 109A positioned on a first end 302A of the PCB 106A and the interface 114 at an end 302B of the PCB 106A opposite of the first end 302A. FIG. 4 illustrates a top-down view 400 of the second PCB 106B including the second connector 109B at an end 402 of the PCB 106B. As illustrated in FIGS. 3 and 4, both the first PCB 106A and the second PCB 106B are dimensioned similarly. The particular size of either or both of the PCB 106A and PCB 106B may vary based on the physical dimension requirements of a housing (not shown) in which they are to be encased in. For example, the second PCB 106B may be sized smaller than the first PCB 106A in some embodiments.

The location of either or both connectors 109A and 109B may vary across embodiments. For example, as shown in FIGS. 3 and 4, the first connector 109A is positioned at a first end 302A of the first PCB 106A and the second connector 109B is connected at a second end 402 of the second PCB 106B. In further embodiments, the first connector 109A is positioned approximately center on the first PCB 106A. Similarly, the second connector 109B may also be positioned approximately center on the second PCB 106B in some embodiments.

As illustrated in FIGS. 2A-4, and as mentioned above, in some embodiments, the first connector 109A and the second connector 109B are used to connect a ball grid array (BGA) and thus are referred to herein as BGA connectors. However, the connectors 109A and 109B are atypical and provide a less complex and cheaper alternative for expanding memory capacity of the device 102 instead of a direct pin and through hole soldered connection of the first PCB 106A and the second PCB 106B together. Additionally, issues arising from soldered pin through hole connections due to insufficient solder mass volume inside of a pin (for example, signal integrity with the transfer of power and/or high speed signals) are avoided with a BGA connector design. The BGA connection is also independent of the thickness of either PCBs 106A and 106B and further reduces the layers of the respective PCB 106A and 106B.

Figure 5A:
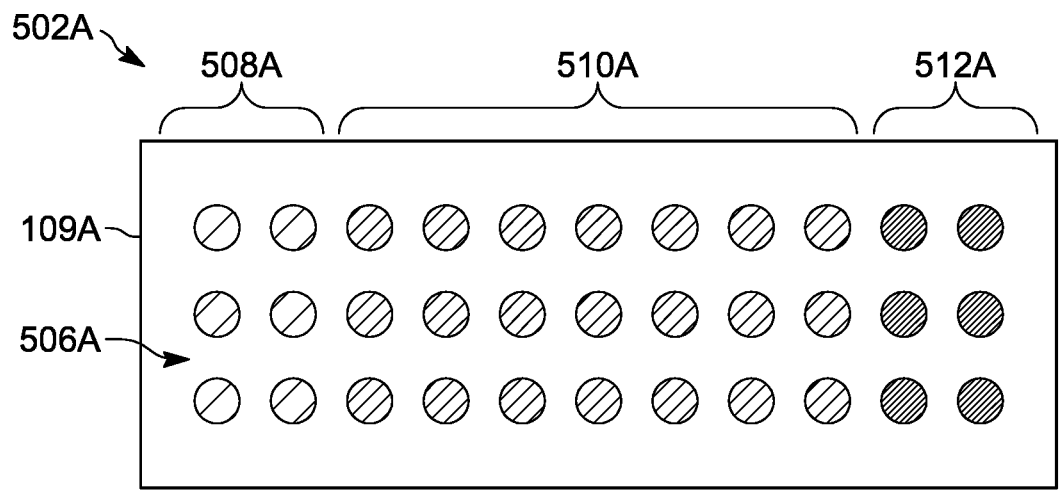
FIG. 5A is a first connector of the first PCB of FIG. 3, in accordance with various aspects of the disclosure.
Figure 5A:
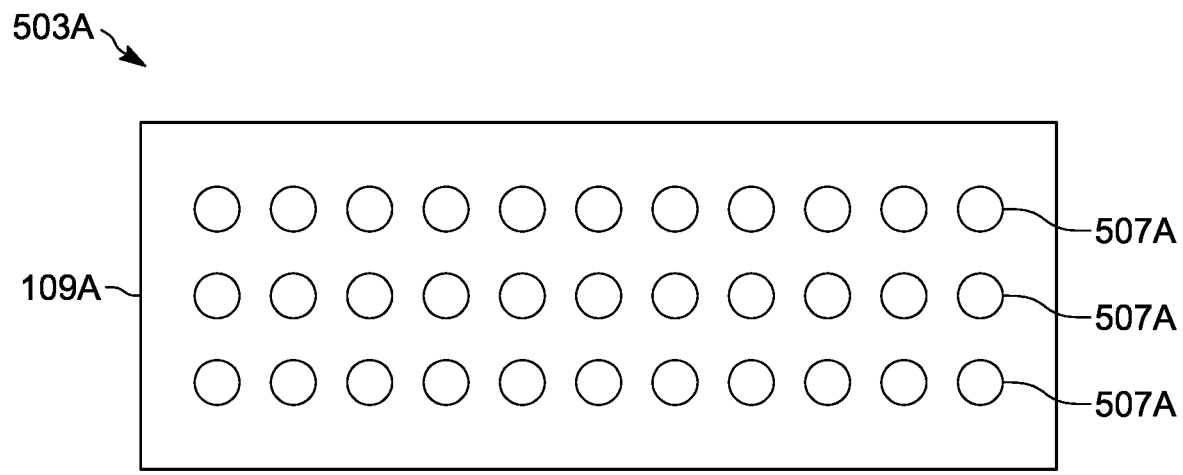
Figure 5A:
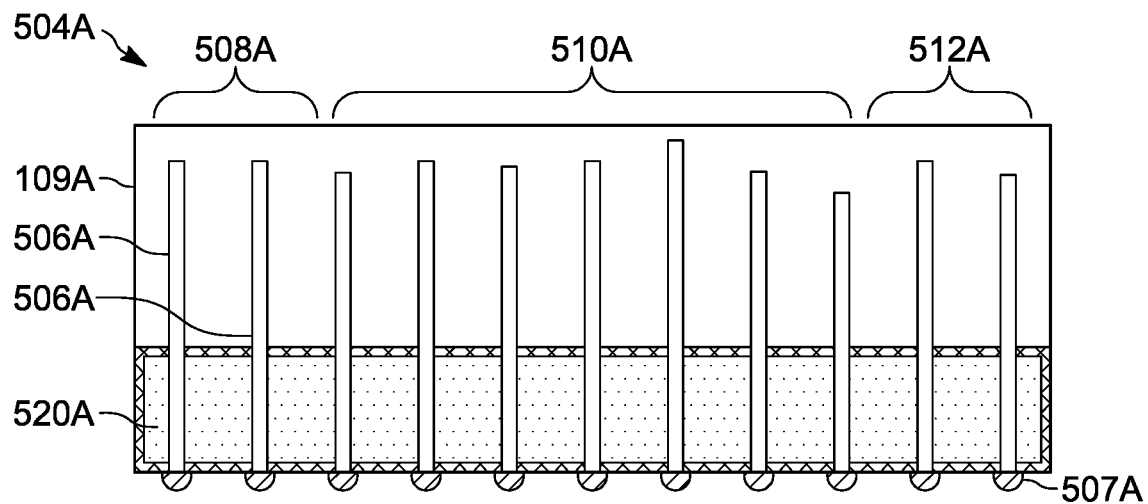

FIG. 5A illustrates a plurality of views 502A-504A of the first connector 109A as one example of a BGA connector. In the illustrated embodiment, the connector 109A is a male BGA socket connector end. As shown in the top view 502A and side view 504A, the connector 109A includes a plurality of pins 506A. The bottom view 503A illustrates a plurality of BGA solder balls 507A for electrical connection of the pins 506A to the components (for example, those illustrated in FIG. 1) disposed on the PCB 106A. The plurality of pins 506A include power pins 508A, communication signal pins 510A (including control and clock signal pins), and ground pins 512A.

Figure 5B:
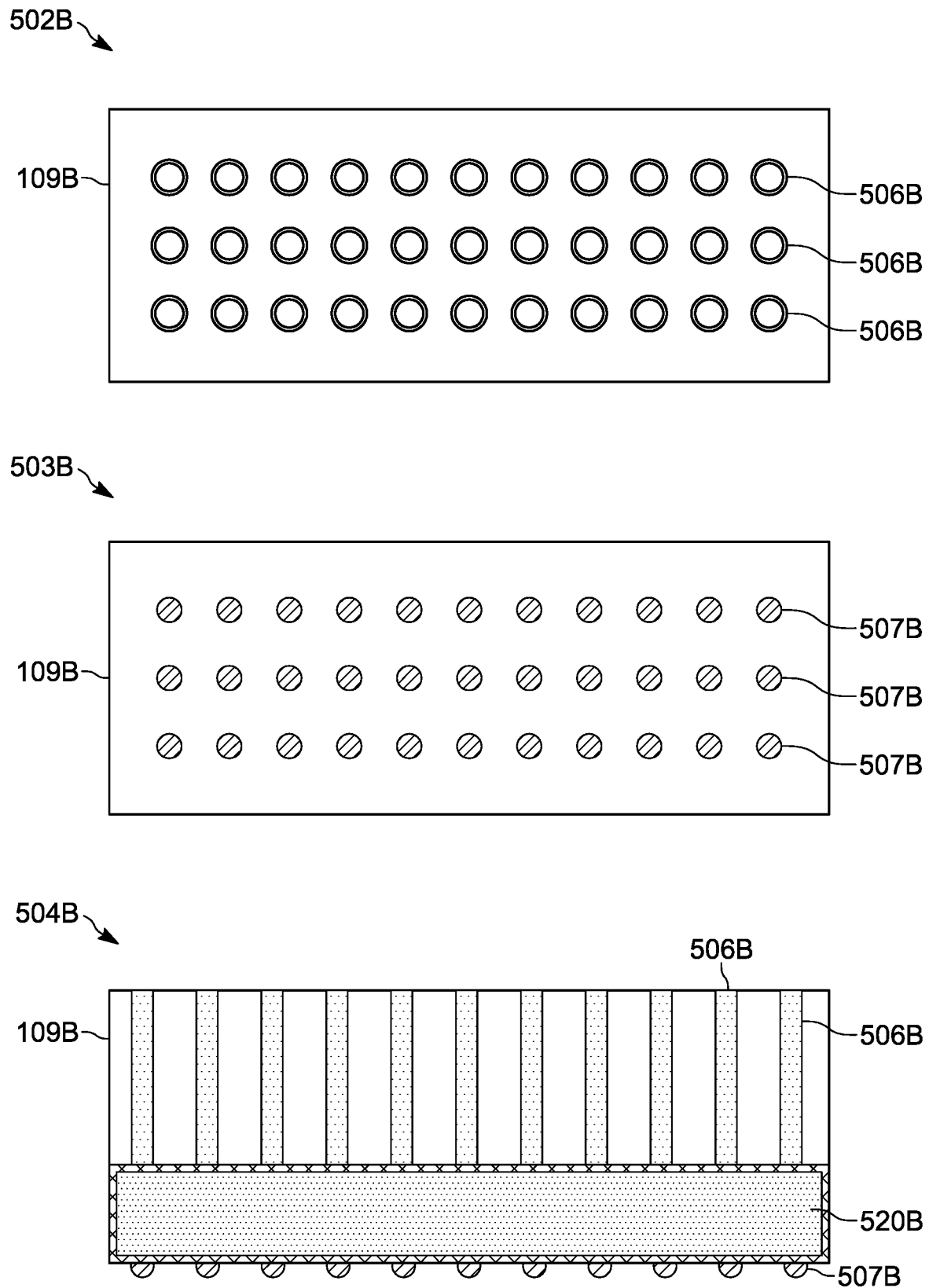
FIG. 5B is a second connector of the second PCB of FIG. 4, in accordance with various aspects of the disclosure.

FIG. 5B illustrates a plurality of views 502B-504B of the second connector 109B as one example of a BGA connector. In the illustrated embodiment, the connector 109B is a female BGA socket connector end relative to the male BGA socket end described above. As shown in the top view 502B and side view 504B, the connector 109B includes a plurality of through holes 506B that each correspond to each of the plurality of pins 506A. The bottom view 503B illustrates a plurality of BGA solder balls 507B for electrical connection of the pins 506A of the first connector 109A to the components (for example, those illustrated in FIG. 1) disposed on the PCB 106B. Each of the plurality of through holes 506B receive a respective pin of the plurality of pins 506A of the first connector 109A. The connection between the first connector 109A and the second connector 109B also may provide a physical support to maintain a space between the connectors 109A and 109B.

The BGA connection type may be advantageous in applications where the connection between the connectors 109A and 109B needs to be durable and include minimal signal lines. However, it should be understood that other male/female socket connector types for establishing both physical connection and/or support and an electronic communications channel (connection) between the first PCB 106A and the second PCB 106B may be used. For example, in some embodiments, the first connector 109A and the second connector 109B may be flex PCB connectors. It should also be noted that the first connector 109A may be a male connector while the second connector 109B is a female connector, or vice versa. It should also be understood that, while components of the first PCB 106A and the second PCB 106B are illustrated as facing each other when connected together, in some embodiments, the components of the first PCB 106A or the second PCB 106B may face away from the other when connected together. The components of one of the first PCB 106A or the second PCB 106B facing away from the other may be implemented to reduce residual heat from the components of one PCB from affecting the components of the other PCB.

Figure 6:
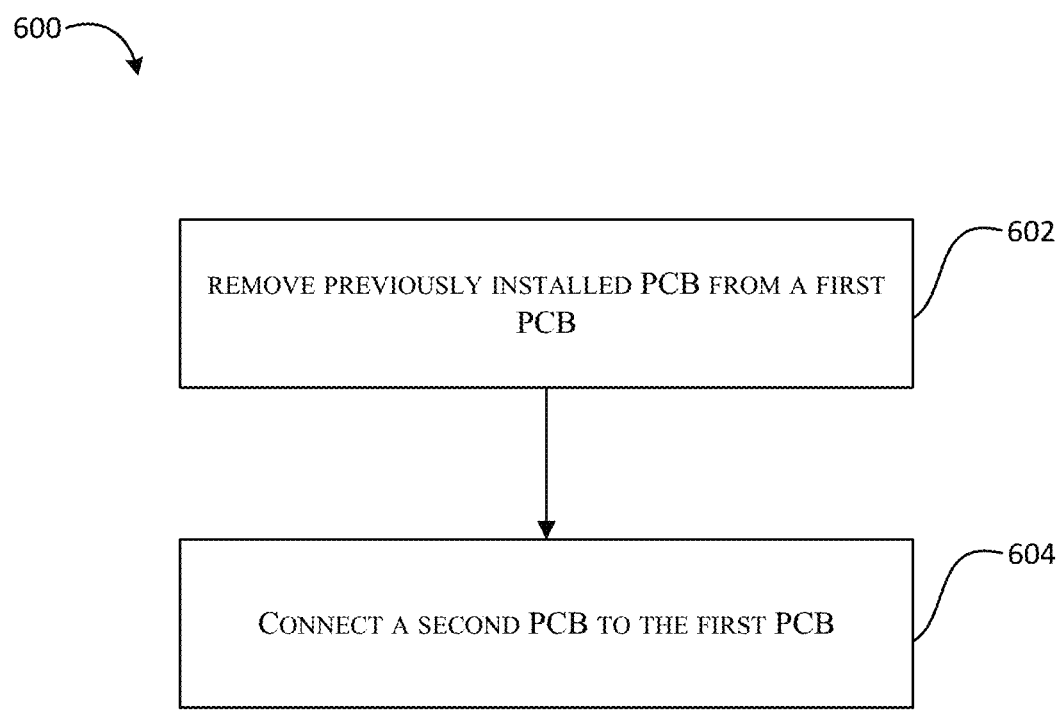
FIG. 6 is a block diagram illustrating method of expanding capacity of the data storage device of FIG. 1, in accordance with various aspects of the disclosure.

FIG. 6 is a diagram illustrating a flowchart illustrating an example method of expanding 600 a memory capacity of the data storage device 102 is shown. The method 600 includes removing (block 602) a previously installed second PCB (e.g., 106C) from the first PCB 106A coupled to the first connector 109A via a second connector (e.g., 109B) of the previously installed second PCB 409B. The previously installed PCB 106C may be configured similar to the second PCB 106B (for example, including a non-volatile memory and a connector configured to couple to the first connector 109A) except that the memory capacity of the NVM 110 of the second PCB 106B is greater than that of the non-volatile memory of the previously installed second PCB 106C to be replaced. The method 200 includes connecting the second PCB 106B to the first PCB 106A via connecting the second connector 109B to the first connector 109A to establish a communication connection between the electronic processor 108 and the NVM 110 (block 604) as shown in FIG. 2B. The attaching of the second connector 109B of the second PCB 106B to the first connector 109A of the first PCB 106A includes a male-to-female connector pair type. In alternative embodiments, the attaching of the second connector 109B to the first connector 109A may include, for instance, depositing solder bumps on respective pads of the a die array (not shown) of the connector 109A or 109B, flipping the PCB 106B, positioning solder bumps on connectors of a substrate 520A or 520B (FIGS. 5A, 5B) of either of the first PCB 106A and/or the second PCB 106B, re-melting the solder bumps (using, for instance, hot air reflow), and applying underfill (using, for instance, capillary action with an electrically-insulating adhesive). The underfill is then allowed to dry/cure.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
a first printed circuit board (PCB) including a controller, an interface configured to interface with a host device, and a first connector; and
a second PCB including a first non-volatile memory and a second connector removably coupled to the first connector to establish a communication connection between the controller and the first non-volatile memory;
wherein the second PCB is removable from the data storage device and replaceable by another PCB including a second non-volatile memory and another connector couplable to the first connector to establish a communication connection between the controller and the second non-volatile memory, the second non-volatile memory having a greater memory capacity than the first non-volatile memory; and
wherein the first and second connectors are ball grid array (BGA) connectors, and wherein the first BGA connector includes first pins connected to first solder balls by way of a first substrate.

2. The data storage device of claim 1, wherein the first connector is positioned at a first end of the first PCB.

3. The data storage device of claim 1, wherein the first connector is positioned approximately at a center of the first PCB.

4. The data storage device of claim 1,
wherein physical dimensions of the data storage device and configurations of the first connector and second connector conform to a standard form factor selected from the group consisting of a peripheral component interconnect (PCI) form factor, a PCI-extended (PCI-X) form factor, and a PCI Express (PCIe) form factor; and
wherein said another PCB is of a same physical size as or of a smaller physical size than the second PCB to fit in a physical space of the second PCB when said another connector is connected to the first connector.

5. The data storage device of claim 2, wherein the first PCB or the second PCB include a guide stop.

6. A data storage system, comprising a data storage device that comprises:
a first printed circuit board (PCB) including a controller, an interface configured to interface with a host device, and a first connector; and
a second PCB including a first non-volatile memory and a second connector removably coupled to the first connector to establish a communication connection between the controller and the first non-volatile memory;
wherein the second PCB is removable from the data storage device and replaceable by another PCB including a second non-volatile memory and another connector couplable to the first connector to establish a communication connection between the controller and the second non-volatile memory, the second non-volatile memory having a greater memory capacity than the first non-volatile memory; and
wherein the first and second connectors are ball grid array (BGA) connectors, and wherein the first BGA connector includes first pins connected to first solder balls by way of a first substrate, and the second BGA connector includes through holes for the first pins to be connected to second solder balls by way of a second substrate.

7. The data storage device system of claim 6, wherein the first connector is positioned at a first end of the first PCB.

8. The data storage device system of claim 6, wherein the first connector is positioned approximately center on the first PCB.

9. The data storage system of claim 6,
wherein physical dimensions of the data storage device and configurations of the first connector and second connector conform to a standard form factor selected from the group consisting of a peripheral component interconnect (PCI) form factor, a PCI-extended (PCI-X) form factor, and a PCI Express (PCIe) form factor; and
wherein said another PCB is of a same physical size as or of a smaller physical size than the second PCB to fit in a physical space of the second PCB when said another connector is connected to the first connector.

10. The data storage device system of claim 7, wherein the first PCB or the second PCB include a guide stop.

11. A method for expanding capacity of a data storage device, wherein the data storage device includes a first printed circuit board (PCB) including a controller, an interface configured to interface with a host device, and a first connector, and further includes a second PCB removable from the data storage device and including a first non-volatile memory and a second connector removably coupled to the first connector to establish a communication connection between the controller and the first non-volatile memory, the method comprising:
providing another PCB connectable to the first PCB, said another PCB including a second non-volatile memory and another connector couplable to the first connector to establish a communication connection between the controller and the second non-volatile memory, the second non-volatile memory having a larger memory capacity than the first non-volatile memory; and
wherein the second PCB is replaceable by said another PCB in the data storage device and wherein the first connector, the second connector, and said another connector are ball grid array (BGA) connectors, and wherein the first BGA connector includes first pins connected to first solder balls by way of a first substrate.

12. The method of claim 11, wherein the first connector is positioned at a first end of the first PCB.

13. The method of claim 11, wherein the first connector is positioned approximately at a center of the first printed circuit board.

14. The method of claim 11,
wherein physical dimensions of the data storage device and configurations of the first connector and second connector conform to a standard form factor selected from the group consisting of a peripheral component interconnect (PCI) form factor, a PCI-extended (PCI-X) form factor, and a PCI Express (PCIe) form factor; and
wherein said another PCB is of a same physical size as or of a smaller physical size than the second PCB to fit in a physical space of the second PCB when said another connector is connected to the first connector.

* * * * *